United States Patent
Hoffbauer et al.

(10) Patent No.: US 6,168,967 B1
(45) Date of Patent: Jan. 2, 2001

(54) REDUCTION OF SURFACE LEAKAGE CURRENT BY SURFACE PASSIVATION OF CDZN TE AND OTHER MATERIALS USING HYPERTHERMAL OXYGEN ATOMS

(75) Inventors: Mark A. Hoffbauer; Thomas H. Prettyman, both of Los Alamos, NM (US)

(73) Assignee: The Regents of the University of California, Los Alamos, NM (US)

( * ) Notice: Under 35 U.S.C. 154(b), the term of this patent shall be extended for 0 days.

(21) Appl. No.: 08/977,860

(22) Filed: Nov. 26, 1997

(51) Int. Cl.$^7$ .......................................... B05D 3/06

(52) U.S. Cl. ............... 438/95; 438/85; 438/767; 148/DIG. 118; 148/DIG. 116; 148/DIG. 93; 148/DIG. 94; 148/DIG. 64

(58) Field of Search ................ 438/767, 85, 95; 148/DIG. 118, DIG. 116, DIG. 93, DIG. 94, DIG. 64

(56) References Cited

U.S. PATENT DOCUMENTS

| | | | |
|---|---|---|---|
| 4,474,829 | * 10/1984 | Peters | 427/53.1 |
| 4,828,817 | * 5/1989 | Outlaw | 423/579 |
| 5,271,800 | * 12/1993 | Koontz et al. | 156/643 |
| 5,627,377 | * 5/1997 | Hamilton, Jr. et al. | 250/370.13 |
| 5,683,757 | * 11/1997 | Iskanderova et al. | 427/525 |
| 5,880,029 | * 3/1999 | Eisenbeiser et al. | 438/694 |

OTHER PUBLICATIONS

Todorov, S, "Low Energy Ion beam oxygidation of Silicon", IEEE Electron Device Letters, vol. EDL–7, No. 8, p468–470, Aug. 1986.*

P.N. Luke et al., "Performance of CdZn Te Coplanar–Grid Gamma–Ray Detectors," Trans. Nucl. Sci. 43, 1481 (1996).

K.-T. Chen et al., "Study of Oxidized Cadmium Zinc Telluride Surfaces," J. Vac. Sci. Technol. A 15, 850 (1997).

Y. Nemirovsky et al., "Plasma Anodization of $Hg_{1-x}Cd_xTe$," Appl. Phys. Lett. 37, 813 (1980).

S.P. Buchner et al., "Summary Abstract: Photochemical Oxidation of (Hg,Cd)Te," J. Vac. Sci. Technol. 21, 446 (1982).

Seong Hoon Lee et al., "New Surface Treatment Method for Improving the Interface Characteristics of CdTe/$Hg_{1-x}Cd_xTe$ Heterostructure," J. Electron. Mater. 26, 556 (1997).

C.T. Lin et al., "Effects of Passivation and Extraction Surface Trap Density on the 1/f Noise of HgCdTe Photoconductive Detector," IEEE Photonics Technology Letters 9, 232 (1997).

M.A. Hoffbauer et al., "Growth of Oxide Layers on Gallium Arsenide with a High Kinetic Energy Atomic Oxygen Beam," Appl. Phys. Lett. 57, 2193 (1990).

* cited by examiner

*Primary Examiner*—Charles Bowers
*Assistant Examiner*—Lisa Kilday
(74) *Attorney, Agent, or Firm*—Samuel M. Freund

(57) ABSTRACT

Reduction of surface leakage current by surface passivation of $Cd_{1-x}Zn_xTe$ and other materials using hyperthermal oxygen atoms. Surface effects are important in the performance of CdZnTe room-temperature radiation detectors used as spectrometers since the dark current is often dominated by surface leakage. A process using high-kinetic-energy, neutral oxygen atoms (~3 eV) to treat the surface of CdZnTe detectors at or near ambient temperatures is described. Improvements in detector performance include significantly reduced leakage current which results in lower detector noise and greater energy resolution for radiation measurements of gamma- and X-rays, thereby increasing the accuracy and sensitivity of measurements of radionuclides having complex gamma-ray spectra, including special nuclear materials.

9 Claims, 4 Drawing Sheets

REDUCTION OF SURFACE LEAKAGE CURRENT BY SURFACE PASSIVATION OF CDZN TE AND OTHER MATERIALS USING HYPERTHERMAL OXYGEN ATOMS

FIELD OF THE INVENTION

The present invention relates generally to the surface passivation of materials and, more particularly, to the significant reduction in surface leakage current and improvement in the resolution of CdZnTe detectors resulting from the passivation of such materials using hyperthermal oxygen atoms. This invention was made with government support under Contract No. W-7405-ENG-36 awarded by the U.S. Department of Energy to The Regents of the University of California. The government has certain rights in the invention.

BACKGROUND OF THE INVENTION

Cadmium zinc telluride, $Cd_xZn_{1-x}Te$, is a wide-bandgap, compound semiconductor that is used for gamma-ray spectroscopy and imaging at room temperature. Spectrometer-grade $Cd_xZn_{1-x}Te$ material ($x \approx 0.1$) is grown commercially using the high-pressure Bridgeman process. At present, small-volume ($<0.1$ cm$^3$) substrates for spectrometry and thin, wide-area substrates for imaging are routinely manufactured for use in a variety of applications, including medical imaging. Larger substrates ($<2$ cm$^3$) have been manufactured that have high bulk resistivity and relatively uniform electronic properties. However, the availability of such samples is presently low.

A principal limitation of CdZnTe is poor hole collection, that is, the trapping length for holes in CdZnTe under typical bias conditions (approximately 1000 V/cm) is routinely less than 1 mm. Electrons, by contrast, have a trapping length of approximately 5 cm so that single-carrier (electron-only) devices up to 2-cm thick can be made. However, in order for these devices to function as spectrometers, compensation for incomplete hole collection is essential. One currently employed compensation method involves the use of coplanar grids. See, for example, "Performance of CdZnTe Coplanar-Grid Gamma-Ray Detectors," by P. N. Luke and E. E. Eissler, Trans. Nucl. Sci. 43, 1481 (1996). Parallel gold or platinum strips are deposited on the surface of the detector and are alternately connected to separate preamplifier circuits. The strips form the anode of the device. One set of strips is biased slightly higher than the other so that it collects the charge. The other set of strips serves to sense charge motion in the device. Subtracting the preamplifier output signals eliminates the effect of charge motion within the device. The difference circuit responds only to charge motion near the electrodes. Because the signal measured by the difference circuit is the same independent of where the electrons originate, excellent resolution and peak-shape are achieved.

To date, the best reported resolution using coplanar grids is about 2% full-width-at-half-maximum (FWHM) at 662 keV for a 1 cm$^3$ detector. The resolution of large-volume ($>2$ cm$^3$) detectors with coplanar grids is highly variable, but is typically less than 5% FWHM at 662 keV. This is significantly better than the commonly used NaI(Tl) detectors in combination with photomultiplier tubes. The energy resolution that can be achieved using CdZnTe is superior to NaI and since CdZnTe is a high-resistivity, wide-bandgap semiconductor which requires minimal power and no cooling, the possibility of increased detector volume and efficiency has lead to renewed interest in CdZnTe.

Manufacturing CdZnTe substrates having uniform electronic properties for gamma-ray spectrometry and imaging is difficult. Attempts to improve CdZnTe for spectroscopy applications have focused on crystal growth to eliminate the effect of variable zinc concentration, grain boundaries, and other structures, such as pipes, which often cause nonuniform charge collection and results in poor detector performance. Some samples have been made which have relatively uniform bulk-electronic properties and perform well as gamma-ray spectrometers. However, a significant number of these samples have high surface leakage current which is a significant source of parallel noise in the charge measurements made in spectrometry. This problem is exacerbated by the use of fine grid structures across which bias is applied; for example, coplanar grids. Additionally, surface leakage may be a significant problem for detectors used for imaging which employ pixels to determine the position of a gamma-ray interaction, as an example. The magnitude of the noise caused by leakage is known to increase with leakage current. Consequently, a direct reduction in the noise can be realized by reducing the leakage current. Other sources of noise limit the magnitude of the reduction that can be achieved through surface treatment; however, in many devices, the leakage noise is sufficiently large that surface passivation is beneficial.

Surface leakage currents are usually dominated by two effects: (1) the presence of localized surface features where the electric field is significantly enhanced; and (2) the presence of a thin surface layer of nonstoichiometric CdZnTe material having an electrical resistivity that is much lower than the underlying CdZnTe substrate. One would expect an electric field enhancement in regions where sharp edges, corners, or surface roughness exist. Since the leakage current is proportional to the localized electric field, these regions will have higher current values than the surrounding smooth areas. For this reason, coplanar-grid detectors, particularly those with fine grid structures, may have high surface-leakage currents.

Chemical etching processes have recently been shown to increase the planarity (smoothness) of CdZnTe crystals. See, e.g., A. Burger et al., "Oxidation Of CdZnTe Materials," Scientific Symposium On Room Temperature X-Ray, Gamma-Ray, and Neutron Detectors," Livermore, Calif., Mar. 11–12, 1997. Improved planarity makes oxidation and passivation requirements for CdZnTe surfaces an even more critical issue. Previous studies reveal that bromine-methanol solutions leave a tellurium-rich surface on CdZnTe crystals consisting of tellurium precipitates. This tellurium-rich layer has an electrical conductivity that is much greater than the underlying stoichiometric CdZnTe (resistivity of $>10^{10}$ $\Omega$-cm). Since the leakage current is proportional to the electrical conductivity, it would be beneficial to have a surface passivation process that reduces the surface electrical conductivity to as small a value as possible.

In "Study Of Oxidized Cadmium Zinc Telluride Surfaces," by K.-T. Chen et al., J. Vac. Sci. Technol. A 15, 850 (1997), the authors describe a method for decreasing surface leakage current for CdZnTe materials using various surface oxidation treatments. In particular, a 15% aqueous solution of hydrogen peroxide was used in the oxidation of detector-grade, $Cd_{0.9}Zn_{0.1}Te$ wafers produced a 37% decrease in surface leakage current.

Plasma oxidation processes have been used to form oxide films on $Hg_{1-x}Cd_xTe$. See, e.g., Plasma Anodization Of $Hg_{1-x}Cd_xTe$," by Y. Nemirovsky and R. Goshen, Appl. Phys. Lett. 37, 813 (1980). However, alternative methods have been explored in order to avoid excessive fixed charge, long term instabilities and substantial depletion of Hg in the semiconductor near the surface. See, e.g., "Summary Abstract: Photochemical Oxidation Of (Hg,Cd)Te," by S. P. Buchner et al., J. Vacuum Technol. 21, 446 (1982).

In "New Surface Treatment Method For Improving The Interface Characteristics Of CdTe/$Hg_{1-x}Cd_xTe$ Heterostructure," by Seong Hoon Lee et al., J. Electron. Mater. 26, 556 (1997), the authors describe chemical oxidation of $Hg_{0.7}Cd_{0.3}Te$ with nitric acid and the subsequent removal of the oxide with ammonium hydroxide in order to prepare the surface for the electron-beam deposition of CdTe. Clearly, the oxide coating formed by chemical means is sufficiently thin to be unable to effectively passivate the surface of the material, and the deposition of CdTe (after removal of the oxide) is responsible for the observed substantial improvement in the electrical properties.

In "Effects Of Passivation And Extraction Surface Trap Density On The 1/f Noise Of HgCdTe Photoconductive Detector," by C. T. Lin et al., IEEE Photonics Technology Letters 9, 232 (1997), the authors describe their previous work on the growth of native oxides on HgCdTe substrates. Because of the extreme temperature sensitivity of the HgCdTe substrate, surface passivation processes are limited to low temperature. Therefore, photo-enhanced native oxides, which were observed to have low leakage current, were formed at 50° C. in a direct photochemical vapor deposition process using $D_2$ lamps as the light source. However, additional passivating layers of ZnS were required to obtain significant improvement in detector performance.

In "Growth Of Oxide Layers On Gallium Arsenide With A High Kinetic Energy Atomic Oxygen Beam," by M. A. Hoffbauer et al., Appl. Phys. Lett. 57, 2193 (1990), passivating oxide layers were formed on GaAs wafers by exposure to a high-kinetic-energy beam of oxygen atoms. However, no mention was made of surface current reduction as a result of the oxide formation thereon.

Accordingly, it is an object of the present invention to reduce surface leakage current in CdZnTe and other materials, such that devices having improved electrical performance can be made therefrom.

Another object of the invention is to reduce surface leakage current in CdZnTe and other materials without using wet-chemical processing, such that devices having improved electrical performance can be made therefrom.

Yet another object of the present invention is to reduce surface leakage current of CdZnTe and other materials without significantly heating the subject material, such that devices having improved electrical performance can be made therefrom.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the method for passivating a suface of a material hereof may include the steps of: evacuating the region surrounding the material; exposing the surface to be passivated to a flux of hyperthermal oxygen atoms for a chosen time period; and maintaining the material at a chosen temperature during the exposure to hyperthermal oxygen atoms.

Preferably, the material includes CdZnTe, HgCd, Te, GaAs, GaP, InP, aluminum, and silicon.

Benefits and advantages of the present invention include reduction in surface leakage current and improvement in detector energy resolution without heating the substrate to high temperatures during the passivation process as occurs when plasma methods are employed for deposition of oxygen atoms and/or growth of oxide passivation layers.

BRIEF DESCRIPTION OF THE DRAWINGS

The accompanying drawings, which are incorporated in and form a part of the specification, illustrate one embodiment of the present invention and, together with the description, serve to explain the principles of the invention. In the drawings.

DETAILED DESCRIPTION

Briefly, the present invention includes a method for reducing the electrical conductivity in the surface region of CdZnTe and other materials by exposing the surface to a high flux of hyperthermal (~3 eV) neutral oxygen atoms in order to oxidize, passivate and polish the surface. It is anticipated by the present inventors that oxygen atom energies between 1 and 10 eV will be effective in achieving these results. The method avoids heating the substrate to high temperatures as occurs using plasma methods for deposition of oxides. Low temperature surface oxidation is important because the CdZnTe substrate material is known to deteriorate at temperatures above ~120° C. The method results in a substantial reduction in the leakage current and a significant improvement in energy resolution of the detector. This increases the accuracy and sensitivity of measurements of radionuclides with complex gamma-ray spectra. In addition, the method is expected to improve the performance and yield of pixellated detectors used for imaging devices (e.g., in medical applications). For these detectors which have small spacing between pixels, surface passivation substantially influences performance and energy resolution.

Figure 1:
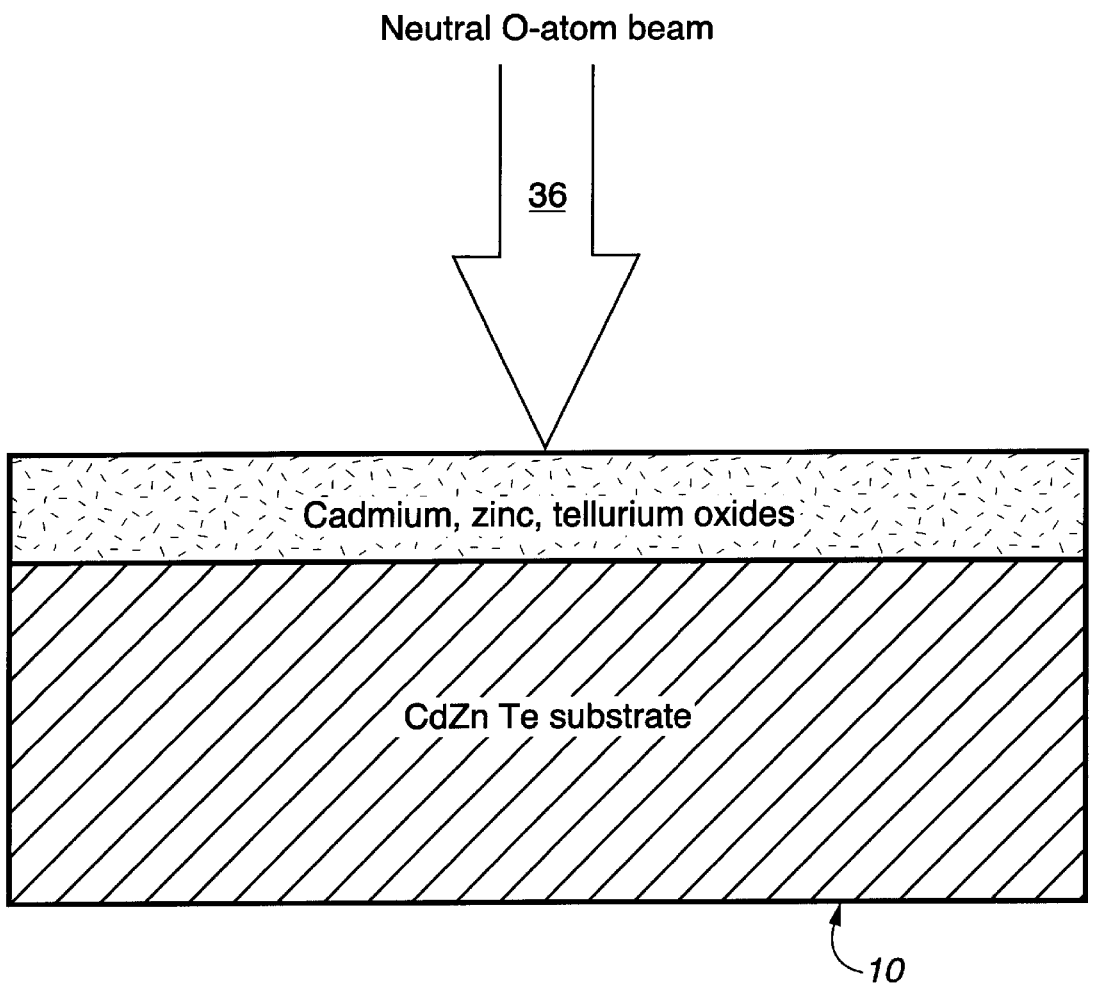
FIG. 1 is a schematic representation of a cross section of a CdZnTe substrate illustrating the formation of surface oxides of the component elements after exposure to a hyperthermal, neutral oxygen atomic beam.
Figure 2:
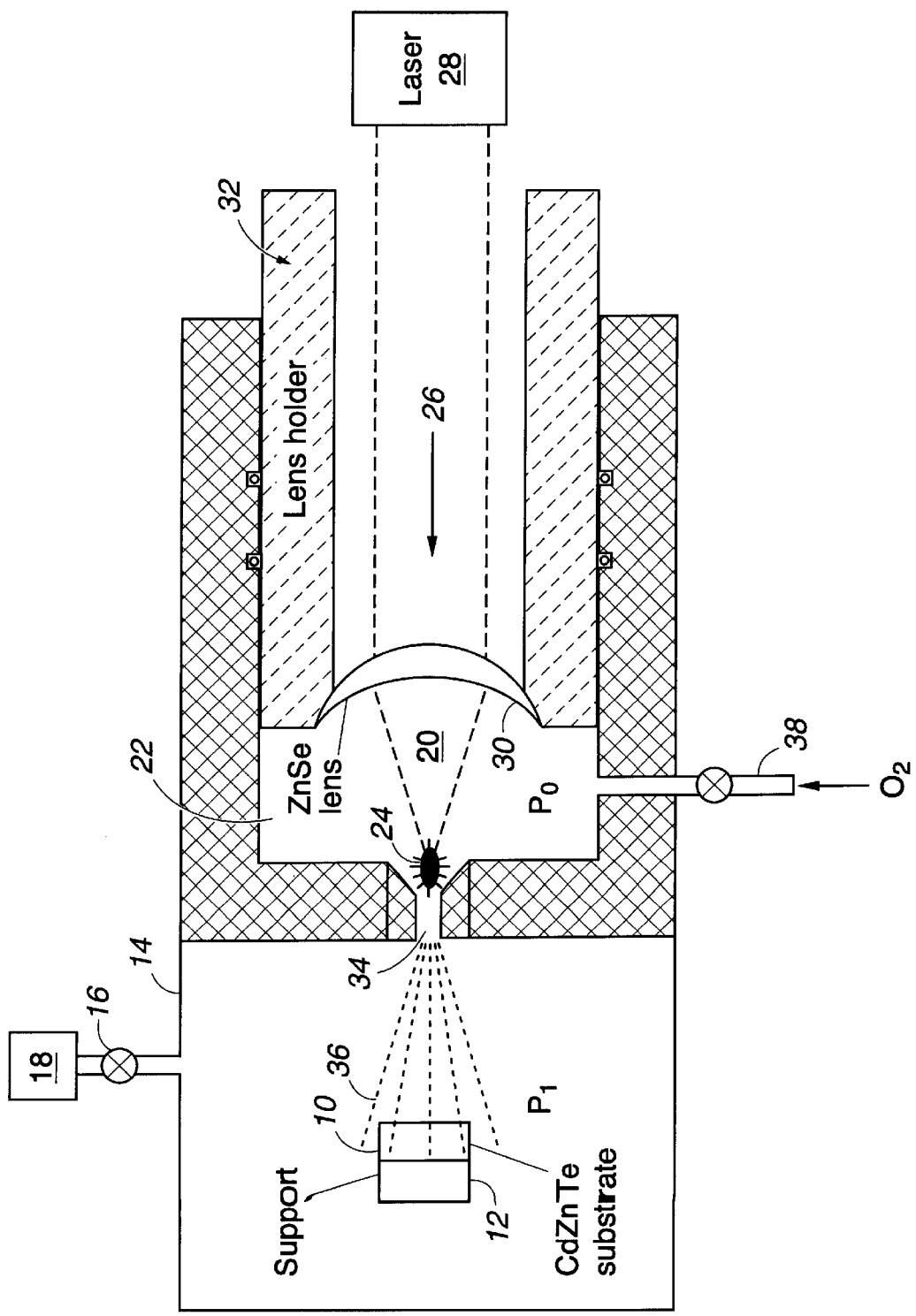
FIG. 2 is a schematic representation of the apparatus used to expose material surfaces to hyperthermal oxygen atoms in order to generate surface oxides as illustrated in FIG. 1 hereof.

Reference will now be made in detail to the preferred embodiments of the present invention, examples of which are illustrated in the accompanying drawings. Similar or identical structure is represented by identical callouts. Turning now to the drawings, FIG. 1 is a schematic representation of a cross section of a CdZnTe substrate, 10, showing the formation of surface oxides of the component elements after exposure to a hyperthermal, neutral oxygen atomic beam 36. The generation of the atomic beam is described more fully in FIG. 2 hereof which shows a schematic representation of the apparatus used to practice the method of the present invention. The CdZnTe sample, 10, to be passivated is located on support, 12, in vacuum chamber, 14, held at pressure, $P_1$. Chamber 14 is evacuated through valve, 16, using vacuum pump, 18. Hyperthermal oxygen atoms are generated in a volume of oxygen gas, 20, at a pressure, $P_O$, in chamber, 22, at the focal point, 24, of laser radiation, 26, generated by carbon dioxide laser, 28. Focusing is accomplished using ZnSe lens, 30, located in movable lens holder, 32, so that the location of focal point 24 may be adjusted relative to nozzle, 34, through which oxygen gas and oxygen atoms, 36, exit chamber 22 and impinge on sample 10. Oxygen gas is introduced into chamber 22 through valve, 38.

Coplanar-grid CdZnTe detectors having high surface leakage currents were used for demonstrating the passivation method. Either gold or platinum contacts were used. Wires were attached to the grids using either a silver paste or a conductive element. No surface cleaning was undertaken other than the removal of dust using dry nitrogen. Prior to surface passivation treatments with hyperthermal oxygen, the intergrid leakage current, noise, and optimum energy resolution of the detectors were measured. The samples 10 were placed in vacuum chamber 14 after being mounted on a manipulator system 12 using an alumina plate and stainless steel clamps (not shown in the Figure). Electrical feedthroughs (also not shown in the Figure) allowed in situ monitoring of the surface leakage current during surface passivation treatments and provided direct information as to the progress of the passivation. The samples were held at either ambient temperatures (~25° C.) or slightly elevated temperatures (<100° C.) during exposure to the hyperthermal oxygen beam source and were located about 300 cm from nozzle 34. At this distance, direct heating of the sample from the hyperthermal oxygen atom source is very small (less than a few ° C.). The incident flux of atomic oxygen impinging upon the detector surface was approximately $5 \times 10^{16}$ atoms/cm$^2$/s (about 5 monolayers/s).

Samples were exposed to the oxygen beam for times that ranged from 5 minutes to 2 hours. At the position where the samples were mounted, the entire face of the detector was exposed to the O-atom beam flux. By turning the sample, the sides could also be exposed to the beam. The intergrid leakage current was measured during sample exposure by first flagging the beam, then turning on a bias source to a fixed voltage (typically about 20 V), waiting for a fixed time (usually 5 minutes), and measuring and recording the surface leakage dark current passing through a load resistor (1 MΩ). These measurements were performed before any surface passivation was begun on a sample and at fixed time intervals during the passivation. Once the surface passivation process was completed, the detector samples were removed and surface leakage dark-current measurements, noise measurements, and gamma-ray energy resolution measurements were performed. Nondetector-grade CdZnTe samples were also processed, and detailed surface analyses that included X-ray photoelectron spectroscopy (XPS) and atomic force microscopy (AFM) measurements were performed.

Figure 3:
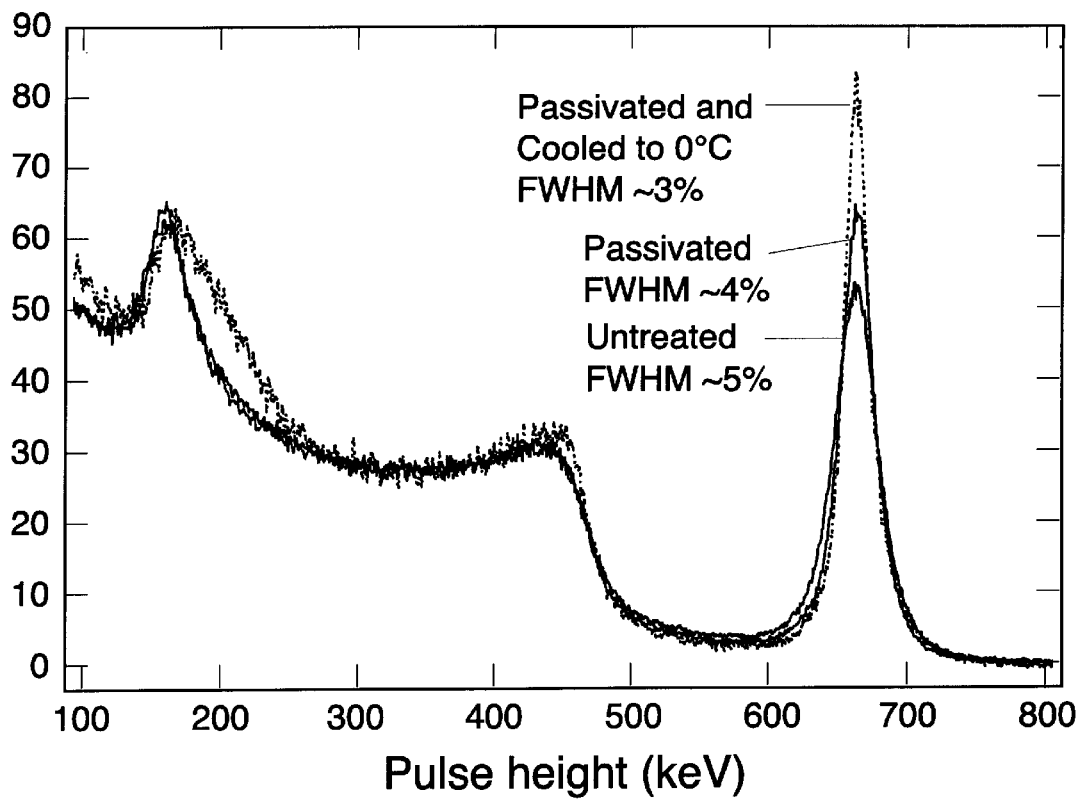
FIG. 3 shows the effect of surface passivation on the detection resolution of CdZnTe radiation detectors.

To demonstrate the effectiveness of this surface passivation approach, a coplanar-grid detector with a separation between grids of 125 μm was passivated. The intergrid leakage current was measured to be 313 nA before surface passivation. The energy optimized resolution of the detector was 5.3% FWHM at 662 keV. Following the first exposure of the anode of the detector to the atomic beam flux for 10 minutes, the intergrid leakage current was observed to drop to approximately 60 nA (about a factor of 5 reduction in surface leakage current). Several subsequent 10 minute exposures of the detector to the atomic beam flux did not significantly reduce the leakage current below this value. Two of the sides of the detector were also processed prior to removing the sample from apparatus. After surface passivation, the optimized energy resolution of the detector was measured and found to have fallen to about 4.0% FWHM at 662 keV, representing an approximately 25% improvement over the value observed before passivation. These results are shown in FIG. 3 which shows the effect of surface passivation on the detection resolution of CdZnTe radiation detectors.

Figure 4:
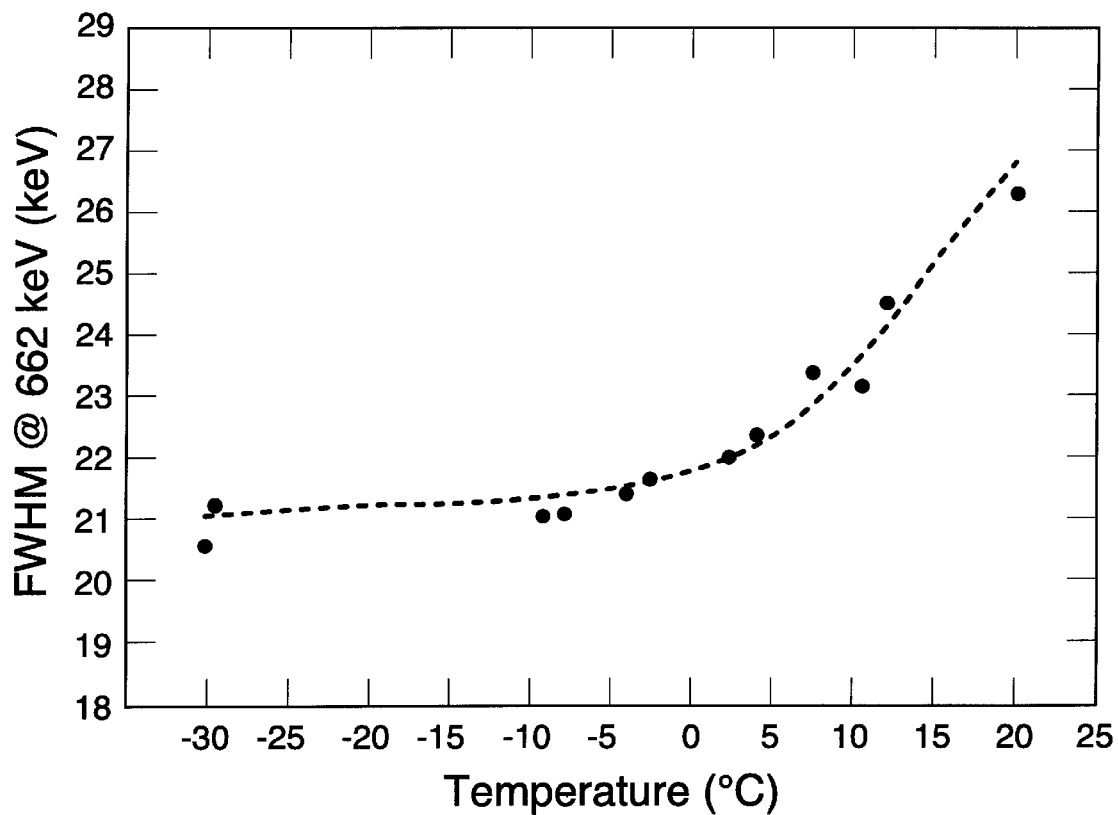
FIG. 4 shows the effect of detector temperature on the detection resolution of hyperthermal-atomic-oxygen-beam-passivated CdZnTe radiation detectors.

The detector and preamplifiers were then cooled to −30° C. to further investigate the noise characteristics of this detector. A further improvement in resolution and reduction of surface leakage current was observed when the detector cooled to 0° C. At 0° C., the resolution of the detector was approximately 3% FWHM at 662 keV as is shown in FIG. 4 hereof. Below 0° C., little improvement in resolution was observed.

An estimate of the reduction in leakage noise can be obtained using the data from the cooling experiment. Resolution in semiconductor detectors depends on electronic noise, systematic effects, and statistical fluctuations in the number of charge carriers produced by the gamma-rays. Fluctuations in charge carrier production are small compared to the other effects and can be neglected. Cooling is known to reduce leakage noise. Therefore, cooling measurements provide an upper bound of 3% to the contribution of systematic effects, which include nonuniform charge induction due to the grid design and imperfections in the substrate, to resolution. This number is consistent with the performance of this grid design on other substrates. The systematic component is subtracted from the measured resolution to estimate the contribution of noise due to leakage which is found to be 28.7 keV FWHM prior to passivation. After passivation, the leakage noise was estimated to drop to 17.4 keV, which is a 40% improvement.

As the gamma-ray energy is reduced, systematic effects diminish, leaving leakage noise as the dominant contributor to resolution. This implies that by using hyperthermal oxygen passivation according to the teachings of the present invention, a larger improvement in resolution can be expected at lower gamma-ray energies. This result is significant since many coplanar grid CdZnTe detectors currently suffer from noise levels that yield a resolution equivalent to NaI detectors at lower energies (below 200 keV). With the 40% reduction in noise using the method of the present invention, detectors passivated using hyperthermal oxygen atoms could be used in place of NaI for low-energy, gamma-ray measurements.

In another set of passivation experiments, two CdZnTe detectors were processed using the method of the present invention. Investigations were also conducted to determine the effect of elevated substrate temperatures (<100° C.) on the passivation process. In all cases, the leakage currents were found to decrease and the energy resolution of the detectors was improved after surface treatment with hyperthermal O-atoms.

To determine the contribution of surface leakage to the overall leakage current, the magnitude of interelectrode leakage through the bulk material was estimated using a three-dimensional semiconductor modeling code. A coplanar-grid detector having 40 electrodes, each 125 microns wide, has a bulk leakage current of 2.55 nA at 30 V differential bias. This example suggests that bulk current leakage is small compared to surface leakage current.

A comparison of hyperthermal oxidation to other related oxidation processes is presented in the Table. This table shows why other processing technologies fall far short in producing desired material properties, especially for low temperature growth of oxides with superior properties and no process-induced substrate damage.

The results obtained for these detectors demonstrate that significant improvements in performance can be made for coplanar-grid CdZnTe detectors by surface passivation. A large reduction in surface leakage current can be achieved by hyperthermal oxidation with a minimal increase in capacitance since the oxide surface layer formed is estimated to be <0.1 μm thick. Surface analysis using XPS of CdZnTe samples exposed to hyperthermal oxygen atoms, according to the teachings of the present invention, provides information concerning the surface chemistry. For example, the surface shows the presence of $TeO_2$, a small quantity of cadmium oxide, and no detectable zinc oxide. There is no detectable unreacted tellurium which indicates that the oxidation process is essentially complete.

TABLE

Comparison of different surface oxidation processes.

| Source Kinetic Energy | Sources Used | Oxidation Process | Process Induced Effects |
|---|---|---|---|
| <0.5 eV (thermal) | Thermal, Plasma, and Reactive Gas Sources | Surface heating required to initiate chemistry | Low damage but problems due to high substrate temperatures |
| 1.0 to 10 eV (hyper-thermal) | Present Atomic Oxygen Beam Source | Kinetic energy initiates unique surface chemistry | No process induced damage to surface or substrate |
| >20 eV | Ion-beam and Plasma Sources | Ion Implantation or physical sputtering drives chemistry | Heavy damage to oxide films and substrates from high energy species |

The absence of substrate Te features in the XPS spectra implies that the $TeO_2$ surface layer has a uniform thickness of greater than ~10 nm. In addition, X-ray diffraction studies have shown the presence of new peaks that may correspond to crystalline $TeO_2$.

The passivation of surfaces on complex compound semiconductors such as CdZnTe through enhanced and energy-selective surface oxidation has been demonstrated. Other materials where surface oxidation and passivation would improve device performance, provided the process can be done at near room temperature, include: (a) HgCdTe, a common infrared detector material; (b) GaAs, an electrooptic semiconductor for high speed communications; (c) GaP and InP, used in photovoltaic devices; (d) aluminum, where high-quality, thin aluminum oxide layers are used as diffusion barriers; and (e) silicon, where very high quality ultrathin oxides determine performance of submicron size devices.

Among the reasons that the present method is expected to achieve similar results for HgCdTe include: (1) Both zinc and mercury are in the same column of the periodic table and are, therefore, expected to behave similarly chemically, especially regarding oxidation. (In the bulk $Cd_{1-x}Zn_xTe$ material, the zinc concentration is usually <0.1 and often nearer to ~0.04, while for $Hg_{1-x}Cd_xTe$, x is approximately 0.25 depending on the specific wavelength where the infrared detector is to be used.); (2) In the past, imaging detectors using HgCdTe were based on photoconductor effects of the bulk material, where surface passivation was thought to have only a small influence on device performance, while current devices are based on metal-insulator-semiconductor (MIS) structures or on p-n diodes which operate as photovoltaic devices, and where surface effects dominate the performance; (3) It is known that the performance of HgCdTe devices is impaired by surface leakage currents arising from fixed surface charge as well as slow and fast interface states. These detrimental effects are influenced by surface defects, surface chemistry, structure, stoichiometry, contamination, roughness, etc., which suggests that passivation with hyperthermal oxygen atoms should result in significant improvements of HgCdTe based devices; (4) Neither material can tolerate high substrate temperature processing. For HgCdTe, temperatures above about 50° C. are known to cause preferential evaporation of Hg from the material which changes the stoichiometry and ultimately the sensitivity of devices made from the material; and (5) Oxide insulating layers have been grown on HgCdTe using $H_2O_2$ with only limited success.

The foregoing description of the invention has been presented for purposes of illustration and description and is not intended to be exhaustive or to limit the invention to the precise form disclosed, and obviously many modifications and variations are possible in light of the above teaching.

The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for reducing the surface leakage current of a material, which comprises the steps of:

(a) evacuating the region surrounding the material;

(b) exposing the surface to be passivated to a flux of hyperthermal oxygen atoms for a chosen time period; and (c) maintaining the material at a chosen temperature during said step of exposure to hyperthermal oxygen atoms, whereby the surface leakage current of the material is reduced.

2. The method for reducing the surface leakage current of a material as described in claim 1, wherein the hyperthermal oxygen atoms have an energy between 1 and 10 eV.

3. The method for reducing the surface leakage current of a material as described in claim 2, wherein the hyperthermal oxygen atoms have an energy of approximately 3 eV.

4. The method for reducing the surface leakage current of a material as described in claim 1, wherein the temperature of the material is chosen such that the electrical properties thereof do not deteriorate.

5. The method for reducing the surface leakage current of a material as described in claim 4, wherein the chosen temperature is between 25° C. and 110° C.

6. The method for reducing the surface leakage current of a material as described in claim 1, wherein the material is configured as a coplanar grid detector.

7. The method for reducing the surface leakage current of a material as described in claim 6, further comprising the step of monitoring the surface leakage current of the surface of the material exposed to the flux of hyperthermal oxygen atoms, whereby the chosen time period for exposure of the surface to hyperthermal oxygen atoms is determined when the surface leakage between adjacent grids no longer decreases.

8. The method for reducing the surface leakage current of a material as described in claim 6, wherein the material is CdZnTe and whereby the chosen time period for exposure of the surface to hyperthermal oxygen atoms is determined when the resolution of the coplanar grid detector for gamma radiation no longer improves.

9. The method for reducing the surface leakage current of a material as described in claim 1, wherein the material is selected from the group consisting of CdZnTe, HgCdTe, GaAs, GaP, InP, aluminum, and silicon.

* * * * *